United States Patent
Lee

(10) Patent No.: US 6,539,953 B2
(45) Date of Patent: Apr. 1, 2003

(54) METHOD AND APPARATUS FOR CLEANING A HEATER BELLOW IN A CHEMICAL VAPOR DEPOSITION CHAMBER

(75) Inventor: Kevin Lee, Hsin-chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 135 days.

(21) Appl. No.: 09/852,590

(22) Filed: May 10, 2001

(65) Prior Publication Data

US 2002/0166574 A1 Nov. 14, 2002

(51) Int. Cl.[7] .............................. B08B 9/093; B08B 3/08
(52) U.S. Cl. .................. 134/22.18; 134/24; 134/166 R; 134/167 R
(58) Field of Search .............................. 134/22.1, 22.18, 134/24, 166 R, 167 R, 168 R, 169 R

(56) References Cited

U.S. PATENT DOCUMENTS

| | | | | |
|---|---|---|---|---|
| 3,593,728 A | * | 7/1971 | Sauer ........................ 134/96.1 |
| 5,109,562 A | * | 5/1992 | Albrecht ........................ 15/56 |
| 5,286,301 A | * | 2/1994 | Albrecht ........................ 134/8 |
| 5,851,307 A | * | 12/1998 | Gilmer et al. .............. 134/22.1 |
| 6,148,832 A | * | 11/2000 | Gilmer et al. ........... 134/166 R |

* cited by examiner

Primary Examiner—Randy Gulakowski
Assistant Examiner—Joseph Perrin
(74) Attorney, Agent, or Firm—Tung & Associates

(57) ABSTRACT

A method and an apparatus for cleaning a heater bellow in a chemical vapor deposition chamber by utilizing a plug and a plug base specifically designed for such cleaning are disclosed. The apparatus consists of the plug and the plug base which can be advantageously mounted in a heater bellow for the filling of the bellow with an oxidizing fluid such as $H_2O_2$. After a suitable soaking period of the oxidizing fluid, the fluid is drained away and then deionized water is used to fill the bellow to rinse the bellow wall and to remove the oxidized compound of metal, such as $WO_3$. During the soaking process by $H_2O_2$ or by deionized water, an inert gas such as argon may be purged through the fluid to improve its uniformity and to improve its interaction with the metal oxide deposition on the bellow wall.

17 Claims, 9 Drawing Sheets

Average (Jan ~ May): 9.8
June: 6.71
Reduction Rate: 31.6% = June/Avg.(Jan ~ May)

Average (Jan ~ May): 9.3
June: 6.17
Reduction Rate: 33.5% = June/Avg.(Jan ~ May)

METHOD AND APPARATUS FOR CLEANING A HEATER BELLOW IN A CHEMICAL VAPOR DEPOSITION CHAMBER

FIELD OF THE INVENTION

The present invention generally relates to a method and an apparatus for cleaning a heater bellow in a chemical vapor deposition chamber more particular, relates to a method and an apparatus for cleaning a heater bellow by using a plug and a plug base for filling the bellow with an oxidizing fluid, rinsing the bellow with deionized water and then blow dry the bellow with an inert gas.

BACKGROUND OF THE INVENTION

Chemical vapor deposition (CVD) technique has been broadly used in depositing semiconductor materials in the semiconductor fabrication technology. For instance, various layers of dielectric materials including those of silicon oxide can be deposited by the CVD technique. Since chemical vapor deposition is a process in which a film can be deposited by a chemical reaction or decomposition of a gas mixture at elevated temperatures on a wafer surface, typical CVD deposited films include single crystal silicon, polycrystalline silicon, silicon oxide, silicon nitride, phosphosilicate glass, borosilicate glass, borophosphosilicate glass, metals and metal compounds.

Chemical vapor deposition can be performed by various techniques including, but not limited to, high density plasma CVD, plasma enhanced CVD and sub-ambient CVD. The high density plasma CVD and the plasma enhanced CVD techniques utilized plasma ions to enhance the deposition rate and to reduce the deposition temperature for achieving obvious processing advantages. For instance, while silicon oxide can be deposited by a traditional CVD method at a temperature of 400° C. or higher, the deposition temperature can be considerably reduced by the plasma enhanced CVD or high density plasma CVD techniques.

In a chemical vapor deposition chamber that is used for depositing silicon oxide, it is inevitable that silicon oxide particles or films are also deposited on the chamber interior away from the wafer surface. After repeated deposition processes are conducted in the chamber, residual oxide deposited on the chamber interior becomes a serious source of wafer contamination. Larger particles or thicker films of oxide tend to peel off from the chamber interior under high vacuum during the deposition process and fall onto the wafer surface. It is therefore necessary, as a preventive maintenance procedure, to clean the chamber interior after a pre-determined number of wafers have been processed in the chamber. One of the more advanced cleaning methods for the chamber interior is in-situ plasma cleaning such as by fluorine-containing etchant gas.

In the cleaning process for a chemical vapor deposition chamber by plasma ions of a fluorine-containing etchant, it is desirable that the endpoint of the cleaning process can be readily identified such that either under-cleaning or over-cleaning can be avoided. When the chamber interior is under-cleaned, particles or films left over may still present a contamination problem to the subsequent deposition process conducted in the chamber. When the chamber interior is over-cleaned, the corrosive etchant may damage the chamber interior and thus cause metal particle contamination. The ability to detect the endpoint of a chamber interior cleaning process is therefore an important requirement of the cleaning technique.

In a conventional cleaning process for plasma enhanced CVD or sub-ambient CVD, radio frequency is used as an energy source for generating plasma gas inside the chamber body, i.e. the plasma is generated in-situ. When the cleaning process is approaching an end, changes in the plasma radiation brightness can be readily used as an index of endpoint. However, in a high density plasma CVD chamber, microwave is used as the energy source for producing plasma ions outside the chamber body, i.e. plasma ions are produced ex-situ. When the cleaning process is approaching an end, any change in the plasma radiation brightness is barely detectable and thus, presenting great difficulties in identifying an endpoint of the cleaning process. As a result, when a high density plasma CVD chamber is cleaned, the cleaning process is normally time-controlled by a trial and error technique. The time-controlled cleaning method (i.e. or time mode) used conventionally is inadequate since it frequently results in over-cleaning of the deposition chamber and thus, damaging the chamber interior.

A particular part of the chamber where the heater is located, i.e. known as the heater bellow, is particularly difficult to clean due to its corrugated structure and its low position in the chamber. As a result, the heater bellow becomes a serious contamination source since deposition byproducts, and specifically metal particles such as W (tungsten) in a W CVD process tend to cumulate in the heater bellow. Conventionally, to clean the heater bellow, a multiplicity of chamber parts such as foreline valve, cooling fan, cylinder, pipes, cables, and hoses must all be removed before the heater bellow can be accessed and cleaned. The task of cleaning a heater bellow therefore requires two technicians working as long as two days to complete the cleaning process. Due to the time consuming nature of the cleaning process, the bellow cleaning is frequently skipped during a routine preventive maintenance procedure resulting in a serious contamination problem for the CVD chamber.

It is therefore an object of the present invention to provide a method for cleaning a heater bellow in a chemical vapor deposition chamber that does not have the drawbacks or shortcomings of the conventional methods.

It is another object of the present invention to provide a method for cleaning a heater bellow in a chemical vapor deposition chamber by providing a specially designed cleaning apparatus and mounting the apparatus in the chamber.

It is a further object of the present invention to provide a method for cleaning a heater bellow in a chemical vapor deposition chamber by first exposing the bellow to an oxidizing fluid and then rinsing the bellow with deionized water.

It is another further object of the present invention to provide a method for cleaning heater bellow in a chemical vapor deposition chamber by first mounting a specially designed cleaning apparatus inside the heater bellow, filling the bellow with an oxidizing fluid, rinsing the bellow with deionized water and then drying the bellow with an inert gas.

It is still another object of the present invention to provide an apparatus for cleaning a heater bellow in a chemical vapor deposition chamber which includes a plug and a plug base for use as a cleaning tool when mounted in the heater bellow.

SUMMARY OF THE INVENTION

In accordance with the present invention, an apparatus and a method for cleaning a heater bellow in a chemical vapor deposition chamber are provided.

In a preferred embodiment, an apparatus for cleaning a heater bellow in a chemical vapor deposition chamber is provided which includes a plug of elongated shape that has a hollow fluid passageway therethrough, the plug has a quick connect fitting on the top end and a threaded pipe fitting at a bottom end, the plug further has a plurality of apertures located in a bottom half of the plug in fluid communication with the hollow fluid passageway; and a plug base that has an inside threaded hole for threadingly engaging the bottom end of the plug and for draining away a fluid from a drain pipe in fluid communication with the inside threaded hole, the plug base further has an outside peripheral surface adapted for fitting intimately into a bottom cavity for the heater bellow.

In the apparatus for cleaning a heater bellow in a chemical vapor deposition chamber, the bottom end of the plug is further equipped with an O-ring for sealingly engaging the inside threaded hole in the plug base. The plug base may be formed in a cylindrical shape which has an inside diameter for the inside threaded hole and an outside diameter defining the outside peripheral surface, the outside peripheral surface of the plug base may be further equipped with a O-ring for sealingly engaging the bottom cavity for the heater bellow. The plug and the plug base may be fabricated of a rigid plastic or metal, or fabricated of aluminum.

The present invention is further directed to a method for cleaning a heater bellow in a chemical vapor deposition chamber which can be carried out by the operating steps of providing a cleaning apparatus that consists of a plug of elongated shape that has a hollow fluid passageway therethrough, the plug has a quick connect fitting on a top end and a threaded pipe fitting at a bottom end, the plug further has a plurality of apertures located in a bottom half of the plug in fluid communication with the hollow fluid passageway, and a plug base that has an inside threaded hole for threadingly engaging the bottom end of the plug and for draining away a fluid from a drain pipe in fluid communication with the inside threaded hole, the plug base further has an outside peripheral surface adapted for fitting intimately into a bottom cavity for the heater bellow; mounting the cleaning apparatus into the bottom cavity of the heater bellow; filling through the top end of the plug an oxidizing fluid into the heater bellow and soaking for a sufficient length of time until substantially all residue on an interior wall of the bellow is oxidized; removing the oxidizing fluid from the heater bellow by draining through the drain pipe; filling through the top end of the plug deionized water into the heater bellow and purging an inert gas through the ionized water; removing the deionized water from the heater bellow by draining through the drain pipe; and filling through the top end of the plug an inert gas or air into the heater bellow to substantially dry the interior wall of the bellow.

The method for cleaning a heater bellow in a chemical vapor deposition chamber may further include the step of wiping the interior wall of the bellow with a lint-free cloth after the deionized water is removed from the heater bellow. The method may further include the step of flowing into the heater bellow to substantially dry the interior wall of the bellow. The method may further include the step of mounting the cleaning apparatus into the bottom cavity of the heater bellow by frictionally engaging an O-ring to an inside wall of the bottom cavity of the bellow, or the step of soaking the interior wall of the heater bellow with the oxidizing fluid for a time period of at least 15 min, or the step of soaking the interior wall of the heater bellow with $H_2O_2$, or the step of soaking the interior wall of the heater bellow with $H_2O_2$ for at least 20 min. The method may further include the step of repeating the filling/removing steps for the oxidizing fluid and the deionized water at least once prior to the drying step by inert gas or air. The method may further include the step of purging Ar gas through the deionized water for at least 10 min, or the step of flowing into the heater bellow $N_2$ gas for drying the interior wall of the bellow, or the step of flowing into the heater bellow $N_2$ gas for at least 20 min. for drying the interior wall of the bellow.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses an apparatus and a method for cleaning a heater bellow in a chemical vapor deposition chamber.

The apparatus is constructed by a plug and a plug base. The plug is formed in an elongated shape with a hollow fluid passageway through the length of the plug. The plug is equipped with a quick connect/disconnect fitting at a top end, and a threaded pipe fitting at a bottom end. The plug is further provided with a plurality of apertures located substantially in a bottom half of the plug which are in fluid communication with the hollow fluid passageway. The plug base has an inside threaded hole for threadingly engaging the bottom end of the plug and for draining away a fluid from a drain pipe that is in fluid communication with the inside threaded hole. The plug base is further provided with an outside peripheral surface that is adapted for fitting intimately into a bottom cavity for the heater bellow.

The present invention method for cleaning a heater bellow in a CVD chamber can be carried out by first providing a cleaning apparatus that includes a plug and a plug base, mounting the cleaning apparatus into a bottom cavity of the heater bellow; filling the heater bellow through the plug an oxidizing fluid for a sufficient length of time until substantially all residue on the interior wall of the bellow is oxidized. The oxidizing fluid is then removed from the heater bellow through the drain pipe, and then the heater bellow is filled with deionized water with an inert gas purging through the ionized water. After the deionized water is removed from the heater bellow, an inert gas is flown through the heater bellow to substantially dry the interior wall of the bellow.

The present invention provides an easy cleaning method and apparatus for a heater bellow in a chemical vapor deposition chamber. By utilizing the present invention novel apparatus and method, particle generation is reduced by approximately 35%, the manpower needed to clean a heater bellow is reduced by about 50%, and the equipment down time due to bellow cleaning is reduced by about 51%.

Figure 1:
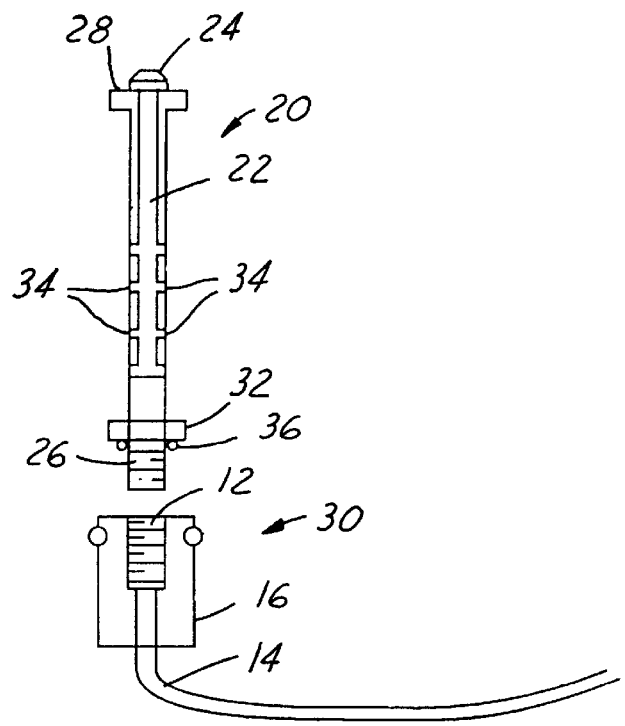
FIG. 1 is a cross-sectional view of the present invention cleaning apparatus of a plug and a plug base.

Referring now to FIG. 1, wherein a present invention bellow cleaning apparatus 10 is showing. The apparatus 10 is constructed by a plug 20 and a plug base 30. The plug 20 is formed in an elongated shape with a hollow fluid passageway 22 through the full length of the plug. The plug 20 is equipped with a quick connection/disconnect fitting 24 at a top end and a threaded pipe fitting 26 at a bottom end. The top end and the bottom end may optionally each include a flange portion 28,32 to facilitate the mounting and handling of the plug 20. The plug 20 is further provided with a plurality of apertures 34 substantially located in a bottom half of the plug 20 in fluid communication with the hollow fluid passageway 22. As shown in FIG. 1, the threaded pipe fitting 26 at the bottom end is further equipped with an O-ring 36 for providing sealing engagement with an inside threaded hole 12 in the plug base 30.

The plug base 30 has an inside threaded hole 12 for threadingly engaging the bottom end, or the threaded pipe fitting 26 of the plug 20. The plug base 30 is further equipped with a drain pipe 14 connected to a bottom end of the inside threaded hole 12 for draining away a fluid from the hole 12. The plug base 30 further has an outside peripheral surface 16 that is adapted for fitting intimately into a bottom cavity 40 for the heater bellow 50 shown in FIG. 2.

Figure 2:
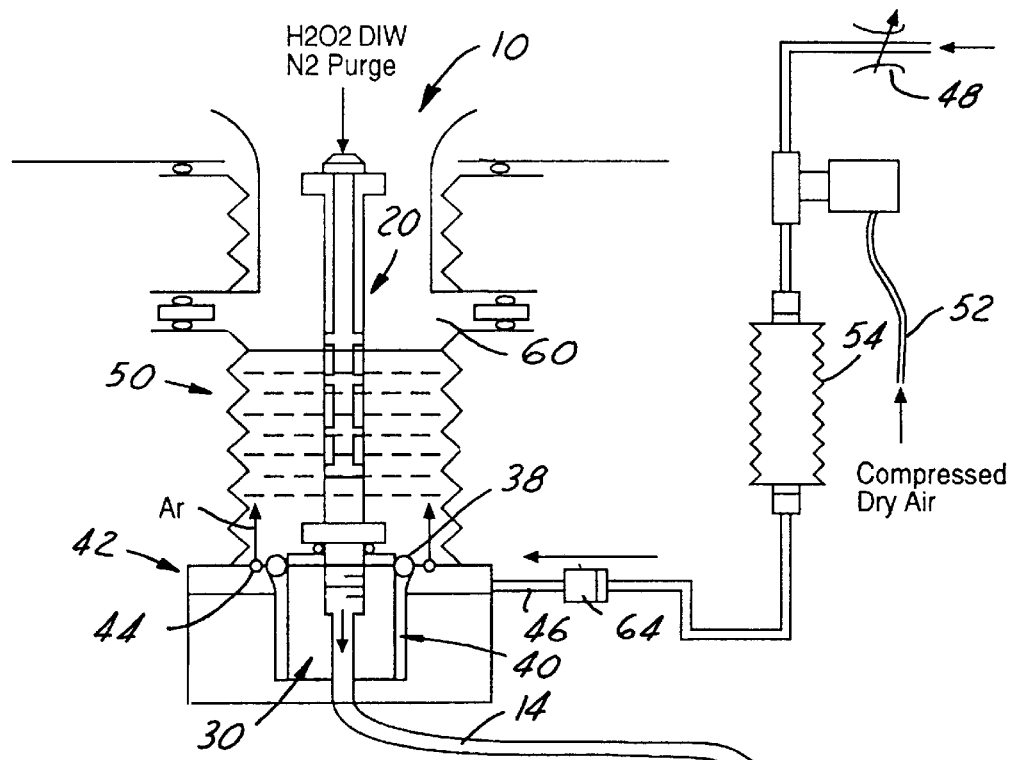
FIG. 2 is a cross-sectional view of the present invention cleaning apparatus installed in a heater bellow of a CVD chamber.

FIG. 2 is a cross-sectional view of the present invention cleaning apparatus 10 mounted in a heater bellow 50 by engaging a bottom cavity 40 of the bellow. The plug base 30 is inserted into the bottom cavity 40 forming a seal by an O-ring 38. The bottom cavity 40 of the heater bellow 50 is formed in a base portion 42. A plurality of apertures 44 is further provided through a top surface of the base portion 42 for the heater bellow 50. The plurality of apertures 44 are in fluid communication with a gas passage 46 that feeds an inert gas under pressure adjusted by a pressure regulator 48 for mixing with compressed dry air 52 and fed through a filter 54 into cavity 60 in the heater bellow 50.

Figure 3:
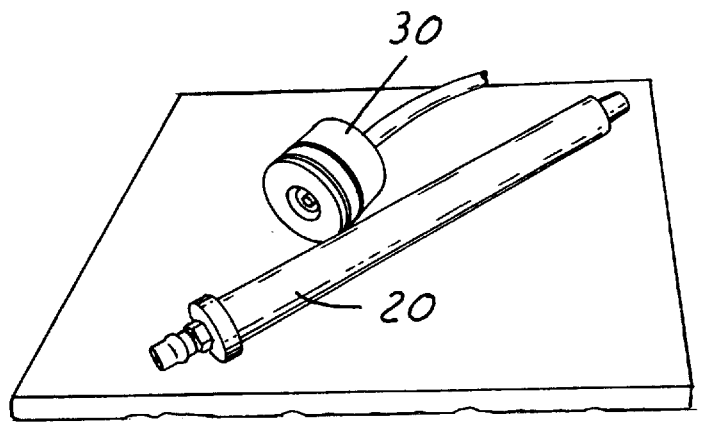
FIG. 3 is an illustration of the present invention cleaning apparatus of a plug and a plug base.
Figure 4:
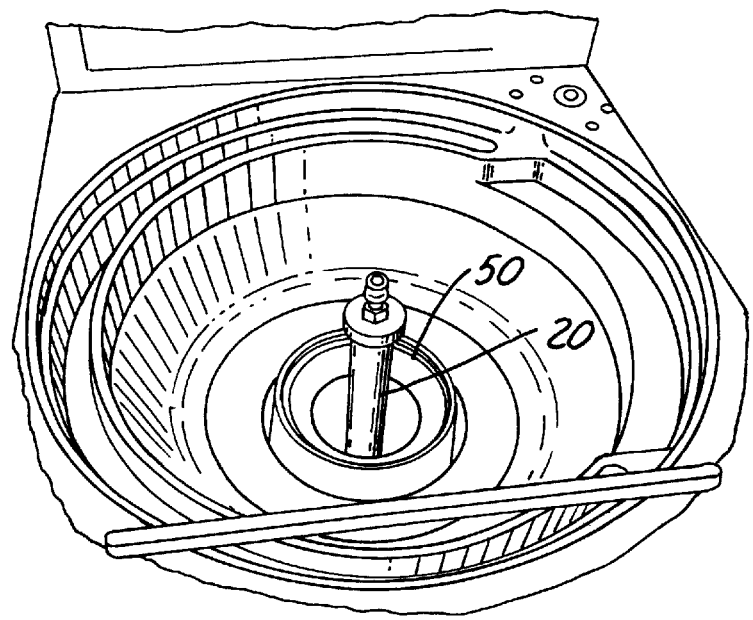
FIG. 4 is a graph illustrating the first step of the cleaning process of mounting the plug base and the plug.
Figure 5:
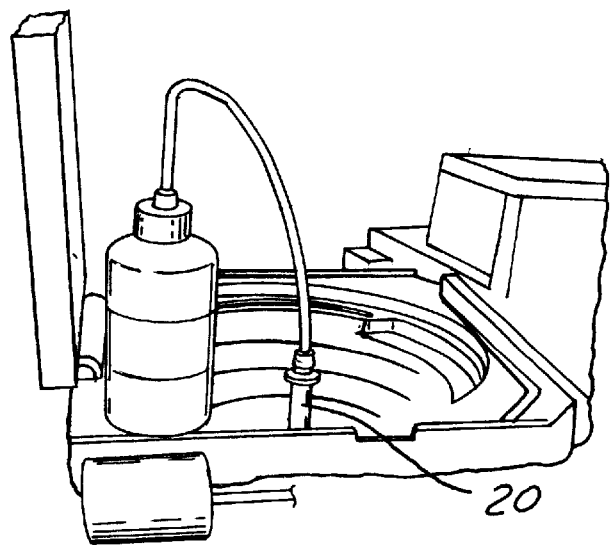
FIG. 5 is a graph illustrating the second step of the cleaning process of filling the heater bellow with $H_2O_2$.
Figure 6:
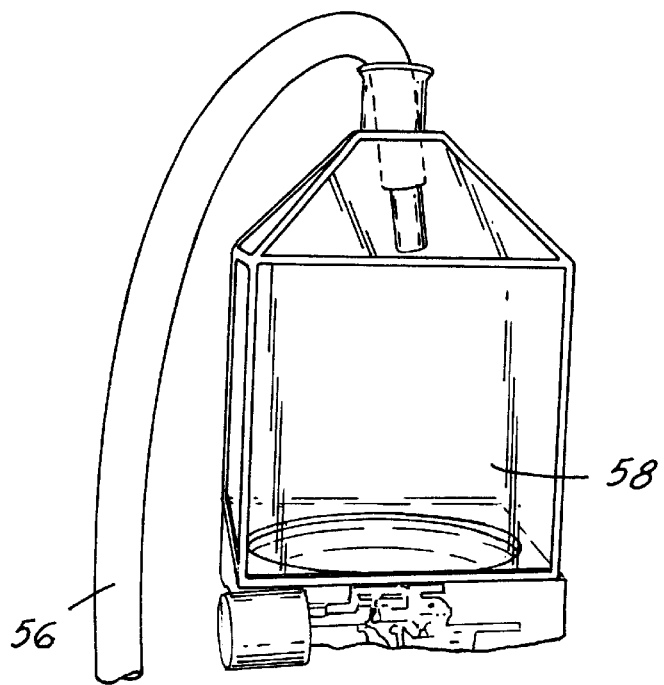
FIG. 6 is a graph illustrating the third step of the cleaning process of purging inert gas through the oxidizing fluid of $H_2O_2$.

The present invention method can be carried out according to the graphs shown in FIGS. 3~9 in seven individual steps. FIG. 3 is a graph illustrating the plug 20 and the plug base 30 which are first inspected prior to the cleaning procedure. In the first step of the cleaning process, as shown in FIG. 4, the plug base is first inserted into a bottom cavity of the heater bellow 50 and then the plug 20 is screwed into the plug base 30 (not shown). An oxidizing fluid such as $H_2O_2$ is then filled into the heater bellow 50 through the plug 20, as shown in FIG. 5. The oxidizing fluid $H_2O_2$ reacts with metal residue on an interior wall of the heater bellow 50 to form an oxide of the metal residue. For instance, when a tungsten CVD chamber is cleaned, the oxidizing fluid $H_2O_2$ reacts with tungsten particles deposited on the wall of the heater bellow to form $WO_3$. The heater bellow 50 is soaked in the oxidizing fluid (as shown in FIG. 2) for a time period of at least 15 min., and preferably for a time period of 30 min. for the oxidation reaction of all metal residues to be completed. During the soaking time, a small amount of argon gas may be bubbled through the oxidizing fluid through apertures 44 to facilitate the mixing and reaction of $H_2O_2$ with tungsten. The exhaust of argon bubble may be picked up by a vacuum hose 56 through an enclosure 58, as shown in FIG. 6.

Figure 7:
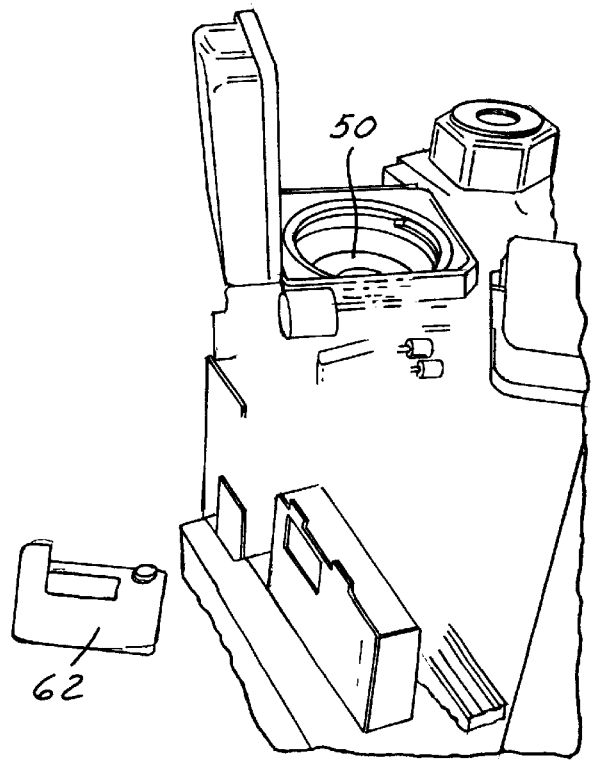
FIG. 7 is a graph illustrating the fourth step of the cleaning process of draining away the oxidizing fluid of $H_2O_2$ or the deionized water.
Figure 8:
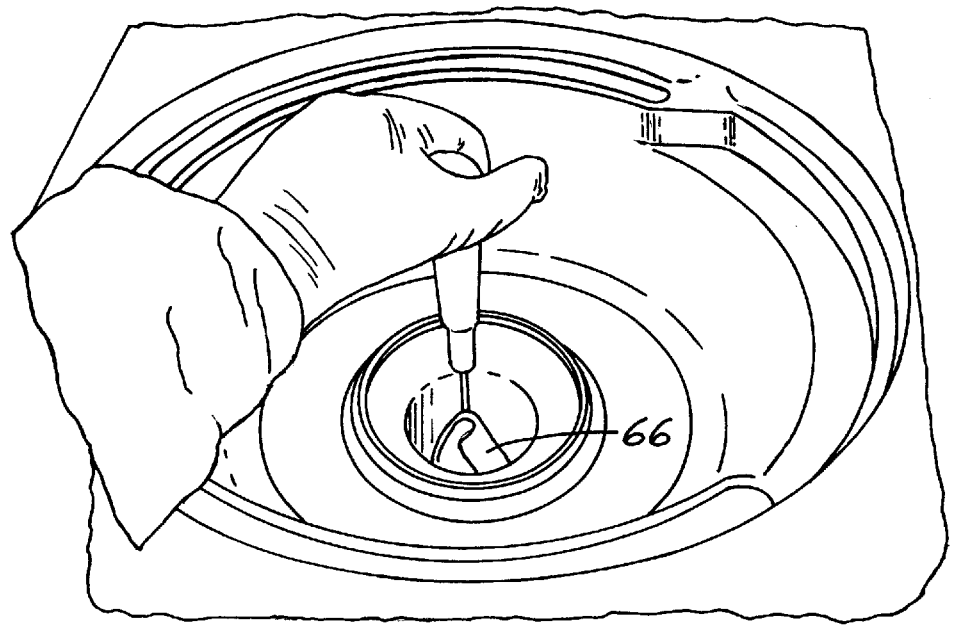
FIG. 8 is a graph illustrating the fifth step of the present invention cleaning process by wiping the heater bellow with dust-free cloth.
Figure 9:
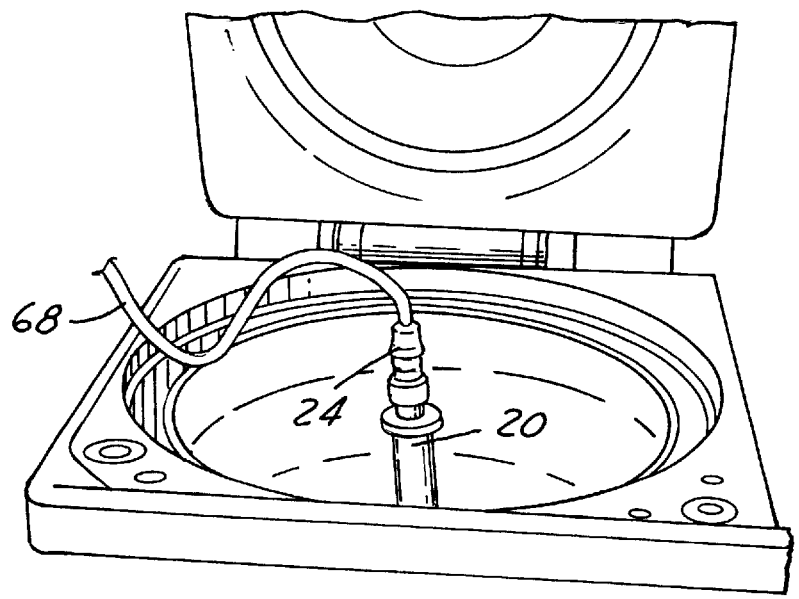
FIG. 9 is a graph illustrating the sixth step of the present invention cleaning process by purging an inert gas through the heater bellow.
Figure 10:
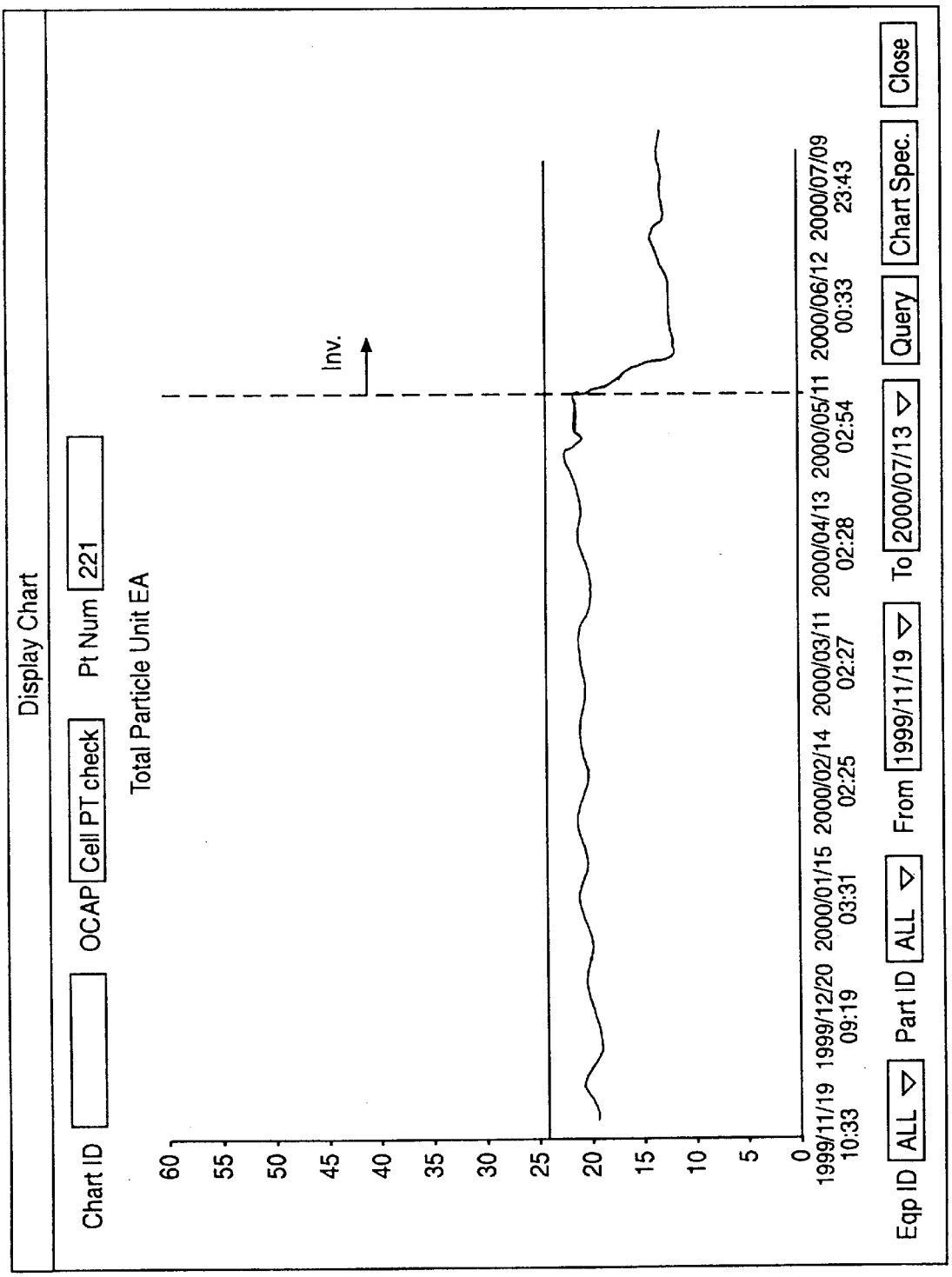
FIGS. 10, 11, 12 and 13 are graphs illustrating the particle counts before and after the implementation of the present invention process in four separate CVD chambers.
Figure 11:
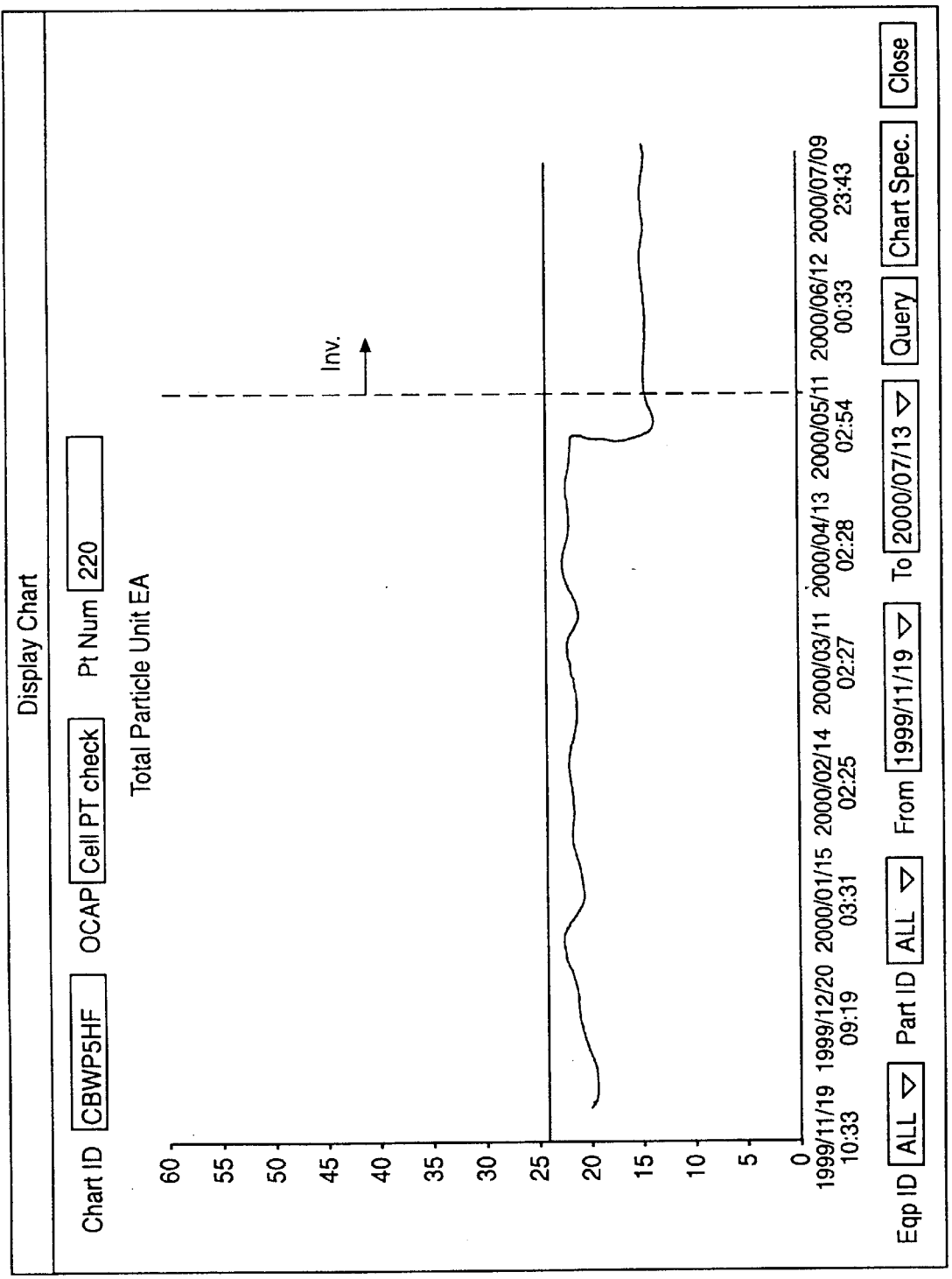
Figure 12:
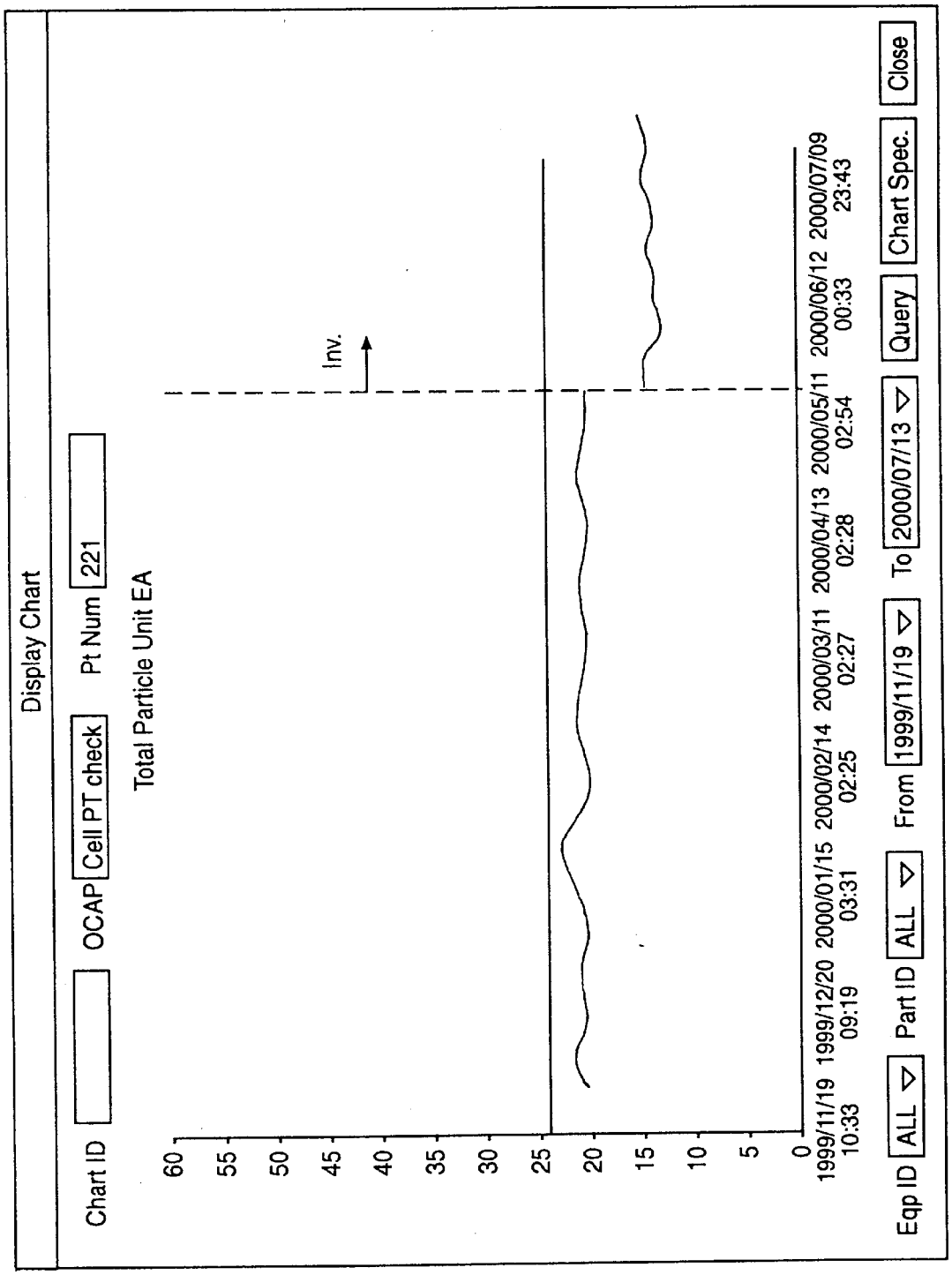
Figure 13:
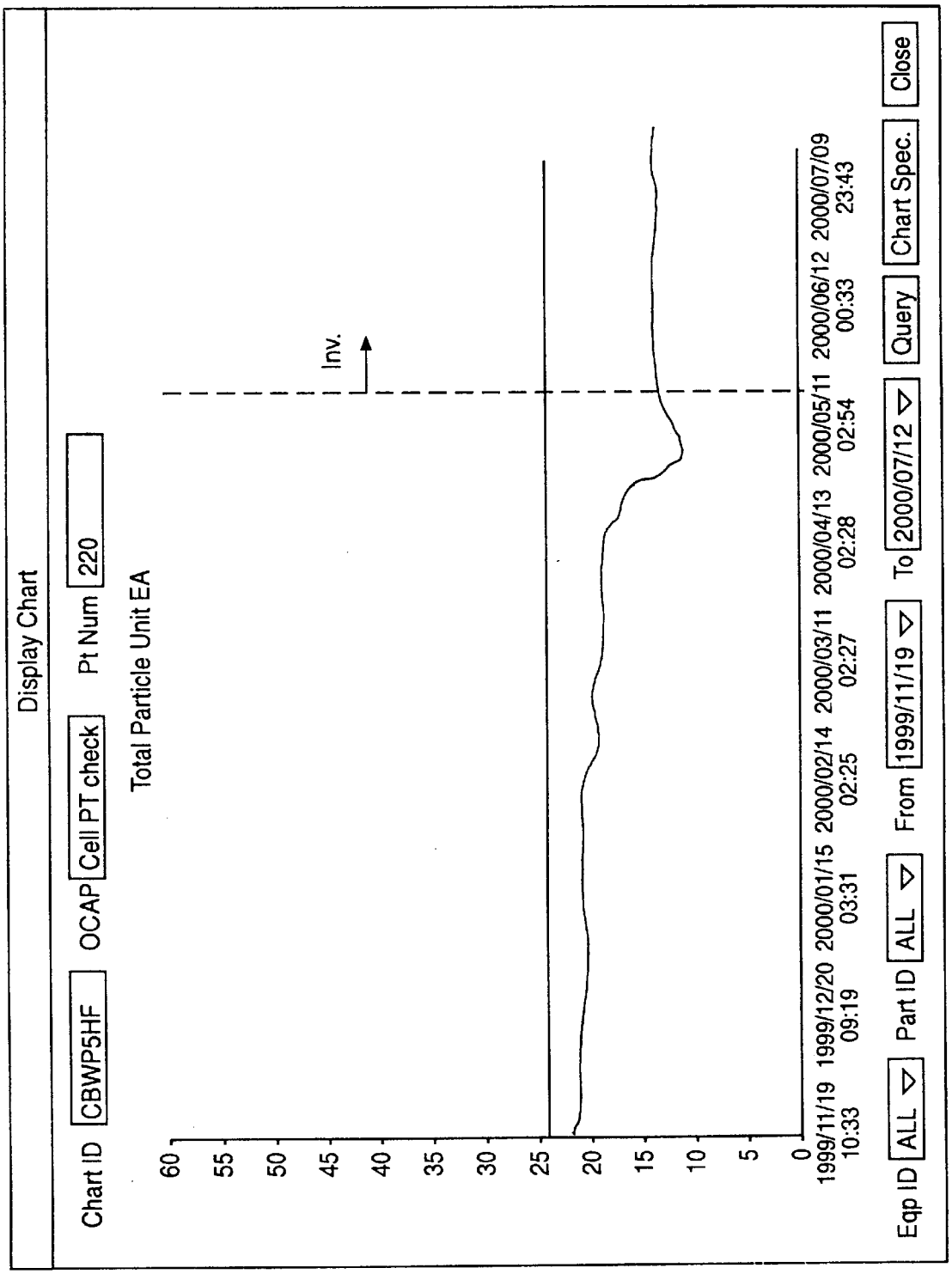

In the next step of the process, as shown in FIG. 7, the oxidizing fluid $H_2O_2$ is drained away from a drain pipe (not shown) into a drain container 62. The heater bellow 50 is then filled with deionized water, similar to that shown in FIG. 5, until the heater bellow 50 is substantially submerged in the deionized water, as shown in FIG. 2. During the ionization water rinsing process, the argon purge valve 64 (shown in FIG. 2) is fully opened to allow a large volume of argon gas to bubble through deionized water for a time period of at least 10 min., and preferably for at least 15 min. The argon bubble purged through the deionized water helps to generate a turbulent flow in the water and thus to facilitate the rinsing operation of the heater bellow wall. After the heater bellow is sufficiently rinsed by the deionized water, the water is drained away, similarly to that shown in FIG. 7 for the draining of the oxidizing fluid. For most applications, the filling and draining steps are repeated at least once with $H_2O_2$ and deionized water in order to thoroughly clean the heater bellow. After the cleaning process is repeated at least once, the heater bellow is wiped with a lint-free cloth 66 to substantially dry the bellow section, as shown in FIG. 8. An inert gas, such as $N_2$ is then connected through a conduit 68, as shown in FIG. 9 to the quick disconnect fitting 24 of the plug 20 for feeding a flow of inert gas into the heater bellow 50 to substantially dry the bellow. The flow of inert gas is kept for a time period of at least 20 min., and preferably for 30 min. to insure that the bellow is thoroughly dried to complete the present invention cleaning process.

The effectiveness of the present invention novel apparatus can be seen in FIGS. 10, 11, 12 and 13 which shows particle counts in four separate CVD chambers both before and after the implementation of the present invention method. It is seen that particle counts are reduced by as much as 30% after the present invention novel method was implemented.

Figure 14:
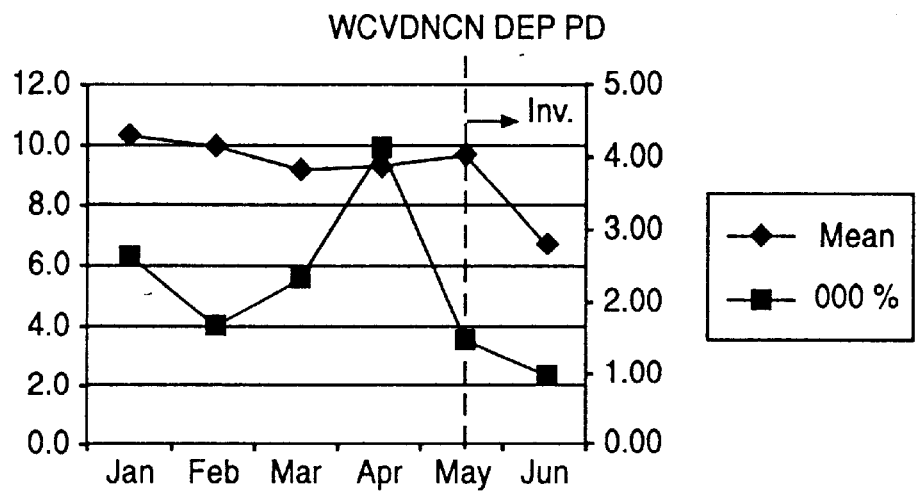
FIGS. 14 and 15 are graphs illustrating the particle counts before and after the implementation of the present invention process in a W CVD process.
Figure 15:
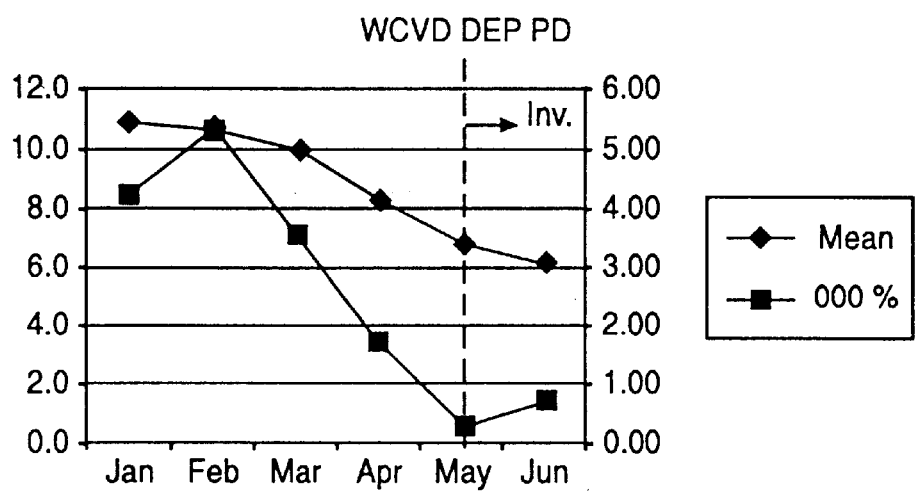

Data show in FIGS. 10–13 are combined into a composite graph, shown in FIGS. 14 and 15 for a constant CVD deposition process. It is seen that after the implementation of the present invention novel cleaning method, the particle contamination problems is significantly reduced by at least 31%.

The present invention novel method and apparatus for cleaning a heater bellow in a chemical vapor deposition chamber has therefore been amply described in the above description and in the appended drawings of FIGS. 1~15.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. An apparatus for cleaning a heater bellow in a chemical vapor deposition chamber comprising:

a plug of elongated shape having a hollow fluid passageway therethrough, said plug having a quick connect fitting at a top end and a threaded pipe fitting at a bottom end, said plug further having a plurality of apertures located in a bottom half of the plug in fluid communication with said hollow fluid passageway; and a plug base having an inside threaded hole for threadingly engaging said bottom end of the plug and for draining away a fluid from a drain pipe in fluid communication with said inside threaded hole, said plug base further having an outside peripheral surface adapted for fitting intimately into a bottom cavity of the heater bellow.

2. An apparatus for cleaning a heater bellow in a chemical vapor deposition chamber according to claim 1, wherein said bottom end of the plug is further equipped with an O-ring for sealingly engaging said inside threaded hole in said plug base.

3. An apparatus for cleaning a heater bellow in a chemical vapor deposition chamber according to claim 1, wherein said plug base is formed in a cylindrical shape having an inside diameter for the inside threaded hole and an outside diameter defining said outside peripheral surface.

4. An apparatus for cleaning a heater bellow in a chemical vapor deposition chamber according to claim 1, wherein said outside peripheral surface of the plug base is further equipped with an O-ring for sealingly engaging said bottom cavity for the heater bellow.

5. An apparatus for cleaning a heater bellow in a chemical vapor deposition chamber according to claim 1, wherein said plug and said plug base are fabricated of a rigid plastic or metal.

6. An apparatus for cleaning a heater bellow in a chemical vapor deposition chamber according to claim 1, wherein said plug and said plug base are fabricated of aluminum.

7. A method for cleaning a heater bellow in a chemical vapor deposition chamber comprising the steps of:

providing a cleaning apparatus consisting of a plug of elongated shape having a hollow fluid passageway therethrough, said plug having a quick connect fitting at a top end and a threaded pipe fitting at a bottom end, said plug further having a plurality of apertures located in a bottom half of the plug in fluid communication with said hollow fluid passageway, and a plug base having an inside threaded hole for threadingly engaging said bottom end of the plug and for draining away a fluid from a drain pipe in fluid communication with said inside threaded hole, said plug base further having an outside peripheral surface adapted for fitting intimately into a bottom cavity for the heater bellow;

mounting said cleaning apparatus into said bottom cavity of the heater bellow;

filling through said top end of the plug an oxidizing fluid into said heater bellow and soaking for a sufficient length of time until substantially all residue on an interior wall of said bellow is oxidized;

removing said oxidizing fluid from said heater bellow by draining through said drain pipe;

filling through said top end of the plug deionized water into said heater bellow and purging an inert gas through said deionized water;

removing said deionized water from said heater bellow by draining through said drain pipe; and flowing through said top end of the plug an inert gas or air into said heater bellow to substantially dry said interior wall of the bellow.

8. A method for cleaning a heater bellow in a chemical vapor deposition chamber according to claim 7 further comprising the step of wiping said interior wall of the bellow with a lint-free cloth after said deionized water is removed from the heater bellow.

9. A method for cleaning a heater bellow in a chemical vapor deposition chamber according to claim 7 further comprising the step of flowing $N_2$ into said heater bellow to substantially dry said interior wall of the bellow.

10. A method for cleaning a heater bellow in a chemical vapor deposition chamber according to claim 7 further comprising the step of mounting said cleaning apparatus into said bottom cavity of the heater bellow by frictionally engaging said O-ring to an inside wall of the bottom cavity of the bellow.

11. A method for cleaning a heater bellow in a chemical vapor deposition chamber according to claim 7 further comprising the step of soaking said interior wall of the heater bellow with said oxidizing fluid for a time period of at least 15 min.

12. A method for cleaning a heater bellow in a chemical vapor deposition chamber according to claim 7 further comprising the step of soaking said interior wall of the heater bellow with $H_2O_2$.

13. A method for cleaning a heater bellow in a chemical vapor deposition chamber according to claim 7 further comprising the step of soaking said interior wall of the heater bellow with $H_2O_2$ for at least 20 min.

14. A method for cleaning a heater bellow in a chemical vapor deposition chamber according to claim 7 further comprising the step of repeating said filling/removing steps for said oxidizing fluid and said deionized water at least once prior to said drying step by inert gas or air.

15. A method for cleaning a heater bellow in a chemical vapor deposition chamber according to claim 7 further comprising the step of purging Ar gas through said deionized water for at least 10 min.

16. A method for cleaning a heater bellow in a chemical vapor deposition chamber according to claim 7 further comprising the step of flowing into said heater bellow $N_2$ gas for drying said interior wall of the bellow.

17. A method for cleaning a heater bellow in a chemical vapor deposition chamber according to claim 7 further comprising the step of flowing into said heater bellow $N_2$ gas for at least 20 min. for drying said interior wall of the bellow.

* * * * *